United States Patent [19]
Smith, Jr.

[11] 3,721,868
[45] March 20, 1973

[54] SEMICONDUCTOR DEVICE WITH NOVEL LEAD ATTACHMENTS

[75] Inventor: Edwin S. Smith, Jr., Camillus, N.Y.

[73] Assignee: General Electric Company, Syracuse, N.Y.

[22] Filed: Nov. 15, 1971

[21] Appl. No.: 198,583

Related U.S. Application Data

[63] Continuation of Ser. No. 863,208, Oct. 2, 1969, abandoned.

[52] U.S. Cl..........317/234 R, 317/234 E, 317/234 G, 317/234 N, 317/234 W

[51] Int. Cl...............................H01l 3/00, H01l 5/00

[58] Field of Search............317/234, 1, 3, 3.1, 4, 4.1, 317/5, 5.4, 5.2, 235, 41.1; 29/572, 573, 574, 575, 576; 148/175; 174/52 PE

[56] References Cited

UNITED STATES PATENTS

| | | | |
|---|---|---|---|
| 2,813,782 | 11/1957 | Spanos | 317/234 |
| 3,155,766 | 11/1964 | Eichert et al. | 317/234 |
| 3,192,083 | 6/1965 | Sirtl | 317/234 X |
| 3,234,320 | 2/1966 | Wong | 174/50.5 |
| 3,311,967 | 4/1967 | Robinson | 317/234 X |
| 3,340,410 | 9/1967 | Sanford | 317/234 X |
| 3,383,760 | 5/1968 | Shwartzman | 317/234 X |
| 3,423,638 | 1/1969 | Dix et al. | 317/101 |
| 3,566,208 | 2/1971 | Wang | 317/234 |
| 3,585,272 | 6/1971 | Shatz | 174/52 S |
| 3,621,114 | 11/1971 | Ref | 174/52 |

*Primary Examiner*—John W. Huckert
*Assistant Examiner*—Andrew J. James
*Attorney*—Robert J. Mooney

[57] ABSTRACT

A header is associated with two leads mediate their ends to form upstanding pin portions. A semiconductive sub-assembly comprised of a stack of junction containing semiconductive elements together with end-most junction-less semiconductive attachment elements are bonded to the pin portions in spaced relation with the header. The semiconductive sub-assembly may be fitted into depressions in the pin portions and a bonding material used to further improve the ohmic connection therebetween. A metal filled settable plastic may be employed for this purpose. The bonding material has an application and setting temperature below the softening temperature of bonding material used to form ohmic interconnections between the elements of the semiconductive sub-assembly. A passivant and a plastic casement surround the semiconductive sub-assembly. In an alternate form, the leads and attachment elements of the semiconductive sub-assembly are associated with an insulative substrate while the junction containing semiconductive elements remain free of contact with the substrate.

1 Claim, 3 Drawing Figures

SEMICONDUCTOR DEVICE WITH NOVEL LEAD ATTACHMENTS

Figure 1:
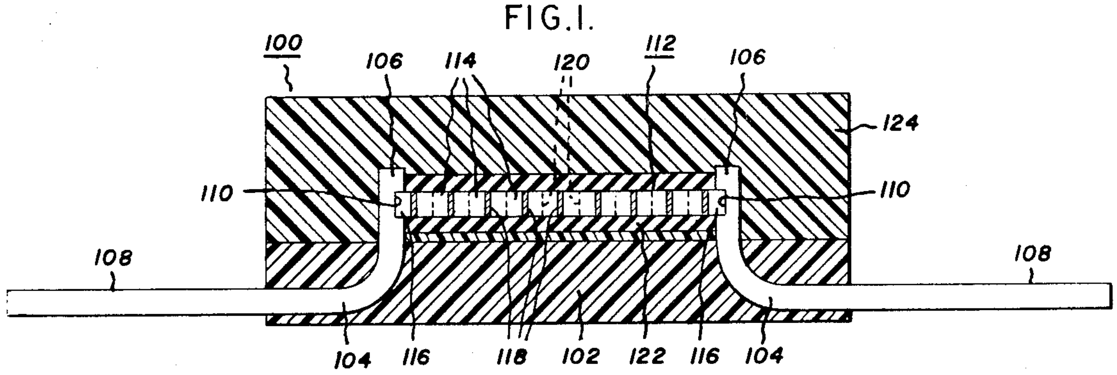

This application is a continuation of my application Ser. No. 863,208, filed Oct. 2, 1969, and now abandoned, titled Plural Element Semiconductor Device With Novel Lead Attachments.

When a single semiconductor device is incapable of blocking sufficiently high voltages across its terminals to meet the requirements of a specific application, it is universally recognized that two or more devices may be serially related to meet the requisite voltage blocking level in combination. This, unfortunately, increases the cost of the electrical function required by a factor corresponding to the number of devices which must be placed in series.

It has heretofore been recognized that instead of merely placing separate semiconductor devices in series the semiconductive crystals making up the devices may instead be joined in series relationship within a single semiconductor device. The series relationship of semiconductive crystals is taught, for example, by Giacoletto, U.S. Pat. No. 2,702,360, issued Feb. 15, 1955; Haberecht, U.S. Pat. No. 3,274,454, issued Sept. 20, 1966; and Gault, U.S. Pat. No. 3,422,527, issued Jan. 21, 1969. While the series relation of semiconductive elements in a single device has been generally recognized, the device constructions employed have continued to be patterned along the lines of semiconductor devices containing single crystals. The result is that semiconductor devices heretofore known to the art having serially related semiconductive elements have not been suited for ready passivation to achieve the maximum obtainable blocking voltages from these elements. Additionally, lead attachment as well as handling and positioning of serially related semiconductive elements have not departed appreciably from practices and structures developed for the production of single crystal semiconductor devices. Accordingly, semiconductor devices containing serially related semiconductor crystals have not fully reflected the performance capabilities and cost savings potentially available.

It is an object of my invention to provide a low cost semiconductor device construction uniquely suited to high voltage rectifier applications by reason of superior passivation of the stacked electrically active semiconductive elements and novel low impedance interconnections between the semiconductive elements and electrical conductors for the device.

This and other objects of my invention are accomplished in one aspect by providing a semiconductor device comprising a pair of conductive leads and an insulative header associated with the leads mediate their ends and dividing each of the leads into a mounting pin portion extending beyond the header in one direction and a device attachment portion extending from the header in a remaining direction. A semiconductive subassembly bridges the mounting pin portions of the leads in spaced relation to the header and include a stack of serially related junction containing semiconductive elements, end-most attachment semiconductive elements of like conductivity type, and low impedance bonding means interposed between and uniting the semiconductive elements of the stack. Means are provided for joining the unitary stack to the mounting pin portions of the leads at temperatures below the softening temperature of the bonding means. Passivating means encapsulate the unitary stack, and protective means encapsulate the passivating means.

In another aspect, I provide a semiconductor device comprising an insulative substrate having first and second landed portions upstanding above an intervening surface. A semiconductive sub-assembly includes spaced semiconductive end portions associated with the landed portion, a mid-portion including a plurality of junction containing semiconductive elements stacked in series relation, means conductively bonding the end portions to the mid-portion and the junction containing semiconductive elements to each other, and the bonding means and mid-portion being spaced from the landed portion and the intervening surface. An electrical conductor is associated with each of the landed portions. Means are provided for joining the end portions of the semiconductive sub-assembly to the electrical conductors comprising a settable plastic composition loaded with conductive particles in an amount sufficient to reduce its resistivity below 10.0 ohm-cm, preferably below 0.01 ohm-cm. Means are provided for passivating the mid-portion of the sub-assembly, and protective means encapsulate the passivating means.

Figure 2:
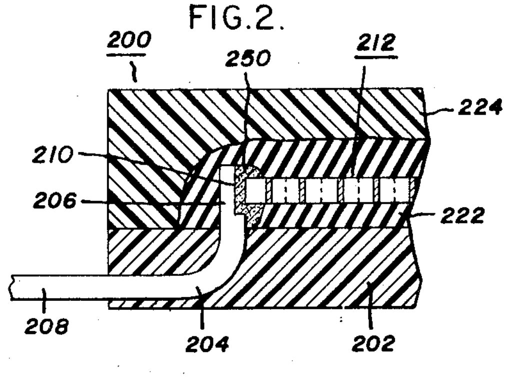
Figure 3:
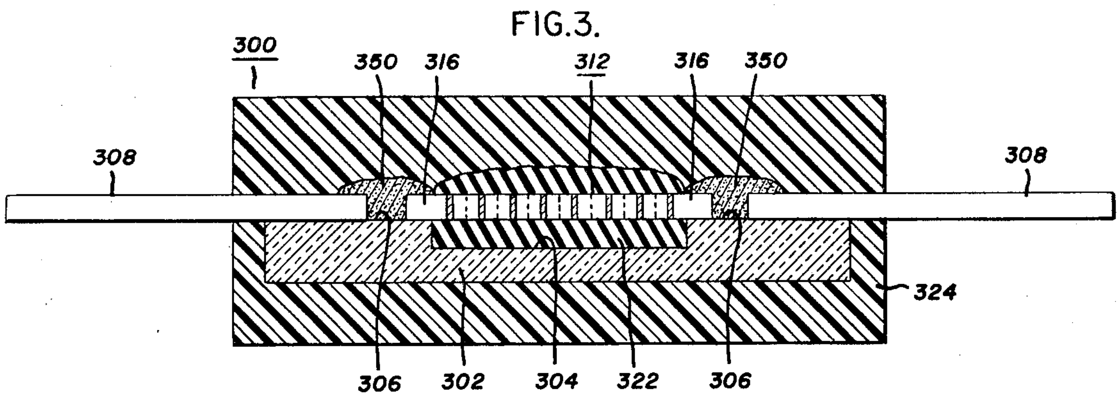

My invention may be better understood by reference to the following detailed description considered in conjunction with the drawings, in which FIG. 1 is a vertical section of a semiconductor device constructed according to my invention, FIG. 2, is a fragmentary sectional view of an alternate semiconductor device constructed according to my invention, and FIG. 3 is a vertical section of another alternate semiconductor device constructed according to my invention.

In FIG. 1 a semiconductor device 100 is illustrated comprised of an insulative header or substrate 102, which is shown molded around leads 104. The header divides the leads into mounting pin portions 106, which extend above the header, and device attachment portions 108, which extend laterally beyond the header. The header resiliently mounts the pin portions of the leads in upstanding spaced relation. Each of the pin portions is provided with a depression or groove 110 on a lateral surface nearest the opposed pin portion.

A semiconductive sub-assembly 112 is fitted into the depressions. The sub-assembly is comprised of a number of serially related junction containing semiconductive elements 114, attachment semiconductive elements 116, and bonding layers 118 joining the elements into a unitary whole. In the form shown each junction containing semiconductive element is provided with a single voltage blocking junction 120, schematically indicated by dashed lines. The junction is located mediate the opposed interconnection surfaces of the junction semiconductive elements 114 to form a zone of N conductivity type on the left of each junction and a zone of P conductivity type on the right side thereof. The attachment elements may be formed entirely of either N or P conductivity type and are typically junctionless. Preferably the attachments elements are of low resistivity (more than $10^{20}$ impurity atoms per cubic centimeter). A body of passivant 122 encapsulates the junction containing semiconductive elements while a plastic casement 124 encapsulates the pin portions of the leads, the sub-assembly, and passivant body, and cooperates with the header. The passivant may be of any conventional type, such as synthetic resin, varnish, silicon oxide, nitride over oxide, glass, etc. I prefer to utilize a coating of silicone varnish with an overlayer of room temperature vulcanizing silicone polymer.

The manufacture of the semiconductor device 100 may be undertaken in a manner readily apparent to a person having ordinary skill in the art. Initially the header 102 may be molded around the leads 108 to fix the pin portions 106 of the leads in the desired spaced relationship. Where the header is formed of other insulative materials, such as glass or ceramic, not readily molded around the leads, grooves and/or apertures may be formed in the header to receive the leads. In such case a separate bonding material may be used to fixedly position the leads relative to the header. The formation of the semiconductive sub-assembly 112 forms no part of my invention, but may be undertaken by techniques well understood in the art, as are disclosed in the previously noted patents, for example. A preferred process for forming the semiconductive sub-assembly is disclosed by Berner in commonly assigned patent application, Ser. No. 863,210, filed on even date herewith, titled A PROCESS FOR FORMING LOW IMPEDANCE OHMIC ATTACHMENTS AND A SEMICONDUCTOR DEVICE PRODUCED THEREBY. The sub-assembly is mounted in the depressions 110 by resiliently deflecting the pin portions 106 and/or header 102 to spread the spacing between the pin portions slightly while inserting the sub-assembly.

It is an advantage of my device structure that each of the junction containing semiconductive elements may be simultaneously freed of surface contaminants after the semiconductive sub-assembly is positioned between the pin portions of the leads. Cleaning of surface contaminants may be accomplished by flowing a conventional etchant over the junction semiconductive elements followed by rinsing with deionized water. It is to be noted that the spacing between the sub-assembly and the header allows all surfaces of the junction elements to be uniformly etched and also allows the etchant to be flowed over the semiconductive elements without impinging on the leads or header. Thus, all the junction semiconductive elements may be uniformly cleaned in a single operation and any tendency of contaminants entrained in the etchant to be back plated (redeposited) is minimized, since the etchant may be directly flowed onto the semiconductive elements and need not contact any other material surface. It is another distinct advantage of my device construction that no further direct handling of the semiconductive sub-assembly is required before passivation, since the sub-assembly may be passivated in situ between the pin portions after cleaning. It is further to be noted that it is unnecessary that the passivant completely overlie the semiconductive attachment elements, since these are junctionless serving merely as ohmic connectors to the junction containing elements of the stack. Consequently, the attachment elements are not highly sensitive to contaminants which would affect operating characteristics of the junction containing semiconductive elements. After passivation the plastic casement 124 may be molded to the header and around the passivant and pin portions according to conventional techniques. The plastic casement is typically formed of epoxy, silicone, or phenolic resin. Instead of a plastic casement the semiconductive sub-assembly and pin portions may be hermetically encased, although it is recognized that plastic encapsulation allows higher voltage to be blocked.

In operation of the semiconductor device 100, the attachment portions 108 of the leads 104 may be connected in an electrical circuit so that when the left hand lead 104 is at a positive potential with respect to the remaining lead current flow is effectively blocked and a substantial potential difference can be sustained across the leads. The junctions 120 of each of the junction containing semiconductive elements 114 efficiently block conduction by reason of cleaning and passivation as above described. The absolute maximum value of the blocking voltage is, of course, not only a function of cleaning and passivation, but also in direct relation to the number of junction containing semiconductive elements serially incorporated within the semiconductive sub-assembly.

When the polarity of the applied potential is reversed--that is, when the right hand lead 104 is at a positive potential with respect to the remaining lead, current will readily flow through the leads and through the intervening semiconductive sub-assembly 112. In this circumstance a low potential difference develops across the leads of the device, since the junctions 120 of the junction containing semiconductive elements 114 are all forwardly biased and the bonding layers 118 provide a low impedance ohmic interconnection between the junction semiconductive elements and to the end-most attachment elements 116. The attachment elements by reason of their high degree of doping and lack of junctions provide a low resistance path therethrough. The interconnections between the pin portions 106 of the leads and the attachments elements contribute only low series forward voltage drops, since the pin portions are resiliently biased inwardly to securely hold the semiconductive assembly and the attachments elements fit into the depressions 110 in the leads. This provides a reasonably low impedance ohmic interconnection between the pin portions of the leads and the semiconductive sub-assembly.

In order to further reduce the forward voltage drop attributable to the pin to sub-assembly interconnections it is possible to interpose a low resistivity bonding material, which is capable of bonding at temperatures below the softening temperature of the bonding layers 118. This assures that the internal ohmic connections within the semiconductive sub-assembly are not adversely affected. For example, a soft solder may be used to positively bond the pin portions to metal coated interconnection surfaces of the attachment elements in a manner well understood in the art.

I have found it advantageous to form a low impedance interconnection between the pin portions of the leads and the attachment elements by utilizing a bonding material which, unlike solder, is fluent at room temperatures. The use of such a bonding material is advantageous, since it allows for ease of positioning in fabricating devices. Because of elevated temperatures the duration of soldering must be regulated and provision made for heat shunts. Further, a degree of skill is required to achieve solder bonding to surfaces.

Accordingly, I prefer to utilize as a bonding material a composition comprised of a settable resin and a conductive additive. The settable resin may be a common bonding plastic or rubber, such as epoxy resin or silicone resin or rubber. Curing agents may be incorporated in the resin at the time it is to be utilized in a manner well understood in the art. The conductive additive is blended into the resin in an amount sufficient to reduce the resistivity of the resulting composition to a level below about 10.0 ohm-cm, preferably below 0.01 ohm-cm. To accomplish this the conductive additive is preferably employed in finely divided form and intimately blended with the settable resin. Typically metal particles of sizes less than 500 microns in mean diameter are utilized. Metal particles of suitable size may be formed by chemical precipitation, vapor plating, sputtering, ball milling, etc. As a specific example, silver is commercially available in graded particle sizes of less than 125 microns mean diameter under the trademark "Silpowder." Instead of silver other common bonding metals, such as aluminum, gold, etc., may be utilized in particulate form.

A variety of suitable resins and rubbers are known to the art that are capable of setting at room temperature or above. I prefer to utilize resins or rubbers which set at or above the maximum operating temperature of the semiconductor device. For example, for semiconductor devices having maximum operating temperatures in the range of from 100° to 250° C. I prefer to utilize resins setting at temperatures in the range of from 100° to 250° C or higher. Typically bonding compositions are utilized which set below 300° C so as to stay well below temperatures at which thermal degradation of the semiconductive sub-assembly could occur and below the softening temperature of internal stack bonding materials. By having the bonding material set at an elevated temperature it is maintained in compression within the device. Should the device be brought to a temperature above the setting point of the bonding material, the differential in thermal expansion characteristics of the semiconductive sub-assembly, the pins, and the header could cause the sub-assembly and its interconnection to the pins to be placed in tension, wholly or partially opening an ohmic interconnection between the pins. By setting the bonding composition above the maximum temperature encountered by the device in use any tendency for ohmic interconnections to be placed in tension and hence opened is obviated.

The construction of a semiconductor device according to my invention incorporating a low temperature pin to sub-assembly ohmic bond may be better appreciated by reference to FIG. 2, which is a sectional detail of a semiconductor device 200. The insulative substrate or header 202 of the device mounts a lead 204 which contains in an upstanding pin portion 206 a depression 210. An end-most attachment element 216 of a semiconductive sub-assembly 212 is ohmically bonded to the pin portion by a body 250 of a settable conductive bonding composition which may be constituted as above described. A body of passivant 222 surrounds the pin portion of the lead, the sub-assembly, and the bonding composition. A plastic casement 224 surrounds the passivant and cooperates with the header. Corresponding elements of the devices 100 and 200 may be similarly constructed, if desired. The device 200 differs from the device 100 principally by the addition of the bonding composition 250 to reduce the forward voltage drop at the pin to sub-assembly interconnection. The bonding body 250 may also be incorporated in the device 100 at the interface between the pin portions 106 and the attachment element 116, if greater reduction of the forward voltage drop of the device 100 is desired.

In FIG. 3 an alternate form of my invention is illustrated by semiconductor device 300. An insulative header or substrate 302 is provided, which is shown formed of glass, but which may be formed of ceramic, plastic, or other conventional insulative material. The substrate is provided with a groove 304 separating lands 306. The lands may be provided with a conductive coating prior to assembly of the device, as by vapor plating a metal, for example. In the preferred form of the invention shown no metallization or other conductive coating of the land surfaces is provided. A semiconductive sub-assembly 312 is mounted to overlie the groove and to rest on the lands. The sub-assembly 312 may be identical to sub-assemblies 112 and 212 and requires no detailed description. It is to be noted that the attachment elements 316 (identical to attachment elements 116 and 216) rest on the lands and support the subassembly with the remaining portions of the sub-assembly spaced from the groove surface intervening the lands. Thus, the mid-portion of the sub-assembly is free of direct contact prior to passivation, facilitating cleaning and passivation similarly as in the devices 100 and 200. The electrical leads 308 are provided with inner extremities resting on the lands and normally spaced from the semiconductive sub-assembly. It is a particular advantage of the device 300 that it is not essential that any critical spatial relationship exist between the leads and the subassembly. This allows the device to be rapidly assembled with minimal attention to maintaining tolerances between the sub-assembly and leads. Settable bonding bodies 350 conductively interconnect the leads and the attachment elements of the semiconductive sub-assembly. The bodies 350 may be formed of a settable bonding composition similarly as body 250. A passivant body 322 surrounds the junction containing elements of the semiconductive sub-assembly. A plastic casement 324 surrounds the inner portion of the leads, the passivant body, and the substrate, leaving only the outer portions of the leads extending therebeyond. If desired the lower surface and edges of the substrate could be left exposed.

While I have described my invention with reference to certain preferred embodiments, it is appreciated that a number of variations will readily occur to those skilled in the art. For example, while I have shown the semiconductive sub-assembly to be formed of a plurality of junction containing semiconductive elements each containing a single junction, it is appreciated that my teaching is applicable to semiconductive elements having $PNN^+$, $P^+PN$, PIN, PNPN, PNP, NPN or other conventional zone and junction arrangements. It is not essential that a plurality of junction containing elements be present in a sub-assembly in order to achieve the advantages of my teachings, nor is it essential that all junction containing semiconductive elements be of like junction characteristics. While leads are shown provided as electrical conductors for the devices, it is appreciated that other conventional conductors may be substituted.

What I claim as new and desire to secure by Letters Patent of the United States is:

1. A semiconductor device comprising a pair of L-shaped conductive leads each having a longitudinally extending device attachment portion and a transversely extending mounting pin portion said mounting pin portion having a depression therein, an insulative header carrying said leads mediate their ends and supporting said leads with their mounting pin portions in spaced confronting relation and their device attachment portions extending from said header in opposite directions, a semiconductive sub-assembly bridging said mounting pin portions of said leads in spaced relation to said header including a unitary stack of serially related junction-containing semiconductive elements, end-most attachment elements of low resistivity and like conductivity type junctionless semiconductor material throughout, and low impedance ohmic metallic bonding means interposed between and uniting the junctionless endmost semiconductive elements of said stack in low impedance contact with said junction containing semiconductor elements, means for joining said junctionless elements in low impedance contact to said respective mounting pin portions in the depressions of said leads at temperatures below the softening temperature of said bonding means comprised of a settable plastic composition contacting both the end faces and side walls of said attachment elements and loaded with conductive particles in an amount sufficient to reduce its resistivity below 10.0 ohm-cm, passivating means encapsulating said unitary stack, and protective means encapsulating said passivating means.

* * * * *